United States Patent
Hayashi et al.

(10) Patent No.: US 8,742,362 B2
(45) Date of Patent: Jun. 3, 2014

(54) LASER ION SOURCE

(71) Applicant: Kabushiki Kaisha Toshiba, Minato-ku (JP)

(72) Inventors: Kazuo Hayashi, Fujisawa (JP); Akiko Kakutani, Yokohama (JP); Akihiro Osanai, Yokohama (JP); Kiyokazu Sato, Tokyo (JP); Tsutomu Kurusu, Tokyo (JP); Takeshi Yoshiyuki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/771,584

(22) Filed: Feb. 20, 2013

(65) Prior Publication Data

US 2013/0161530 A1    Jun. 27, 2013

Related U.S. Application Data

(63) Continuation of application No. PCT/JP2011/074493, filed on Oct. 25, 2011.

(30) Foreign Application Priority Data

Oct. 29, 2010  (JP) ................................. 2010-244302

(51) Int. Cl.
   - H01J 27/24 (2006.01)
   - H01J 27/02 (2006.01)
   - H01J 49/10 (2006.01)

(52) U.S. Cl.
   USPC ................... 250/423 P; 250/423 R; 250/430; 250/288; 250/286; 250/281

(58) Field of Classification Search
   USPC .......... 250/423 P, 423 R, 430, 288, 286, 281; 315/111.81
   See application file for complete search history.

(56) References Cited

U.S. PATENT DOCUMENTS

| 5,107,170 A | 4/1992 | Ishikawa et al. |
| 6,744,225 B2 | 6/2004 | Okamura et al. |

(Continued)

FOREIGN PATENT DOCUMENTS

| JP | 63-21735 A | 1/1988 |
| JP | 1-154448 A | 6/1989 |

(Continued)

OTHER PUBLICATIONS

International Search Report issued Jan. 17, 2012 in PCT/JP2011/074493 filed Oct. 25, 2011 (with English Translation).

(Continued)

Primary Examiner — Nikita Wells
(74) Attorney, Agent, or Firm — Oblon, Spivak, McClelland, Maier & Neustadt, L.L.P.

(57) ABSTRACT

According to one embodiment, a laser ion source is configured to generate ions by application of a laser beam, the laser ion source including a case to be evacuated, an irradiation box disposed in the case and including a target which generates ions by irradiation of laser light, an ion beam extraction mechanism which electrostatically extracts ions from the irradiation box and guides the ions outside the case as an ion beam, a valve provided to an ion beam outlet of the case, the valve being opened at ion beam emission and being closed at other times, and a shutter provided between the valve and the irradiation box, the shutter being intermittently opened at ion beam emission and being closed at other times.

8 Claims, 6 Drawing Sheets

(56) References Cited

U.S. PATENT DOCUMENTS

| | | | |
|---|---|---|---|
| 7,405,397 B2 * | 7/2008 | Covey et al. | 250/288 |
| 8,003,934 B2 * | 8/2011 | Hieke | 250/288 |
| 2013/0221234 A1 * | 8/2013 | Kakutani et al. | 250/423 P |
| 2013/0228698 A1 * | 9/2013 | Kakutani et al. | 250/423 P |

FOREIGN PATENT DOCUMENTS

| | | |
|---|---|---|
| JP | 2-273440 A | 11/1990 |
| JP | 6-13199 A | 1/1994 |
| JP | 2001-076635 A | 3/2001 |
| JP | 2005-235697 A | 9/2005 |
| JP | 3713524 B1 | 9/2005 |
| JP | 2007-198996 | 8/2007 |
| JP | 2009-037764 A | 2/2009 |
| JP | 2010-080159 A | 4/2010 |

OTHER PUBLICATIONS

Written Opinion issued Jan. 17, 2012 in PCT/JP2011/074493 filed Oct. 25, 2011.

International Preliminary Report on Patentability and Written Opinion issued May 23, 2013, in International application No. PCT/JP2011/074493 (English translation only).

* cited by examiner

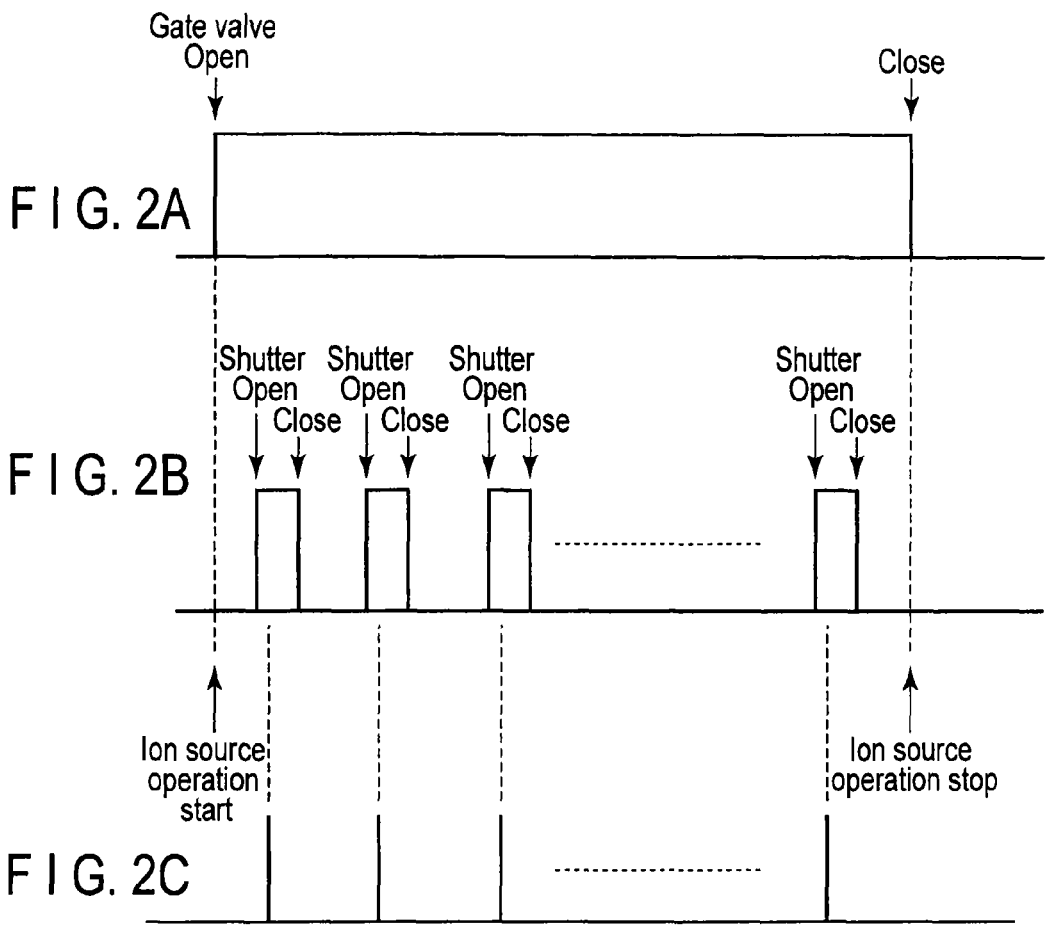
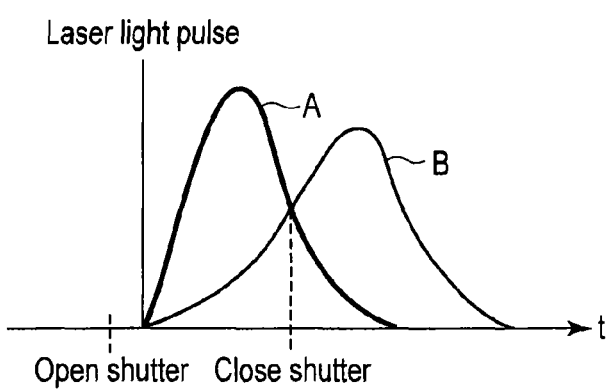
F I G. 3

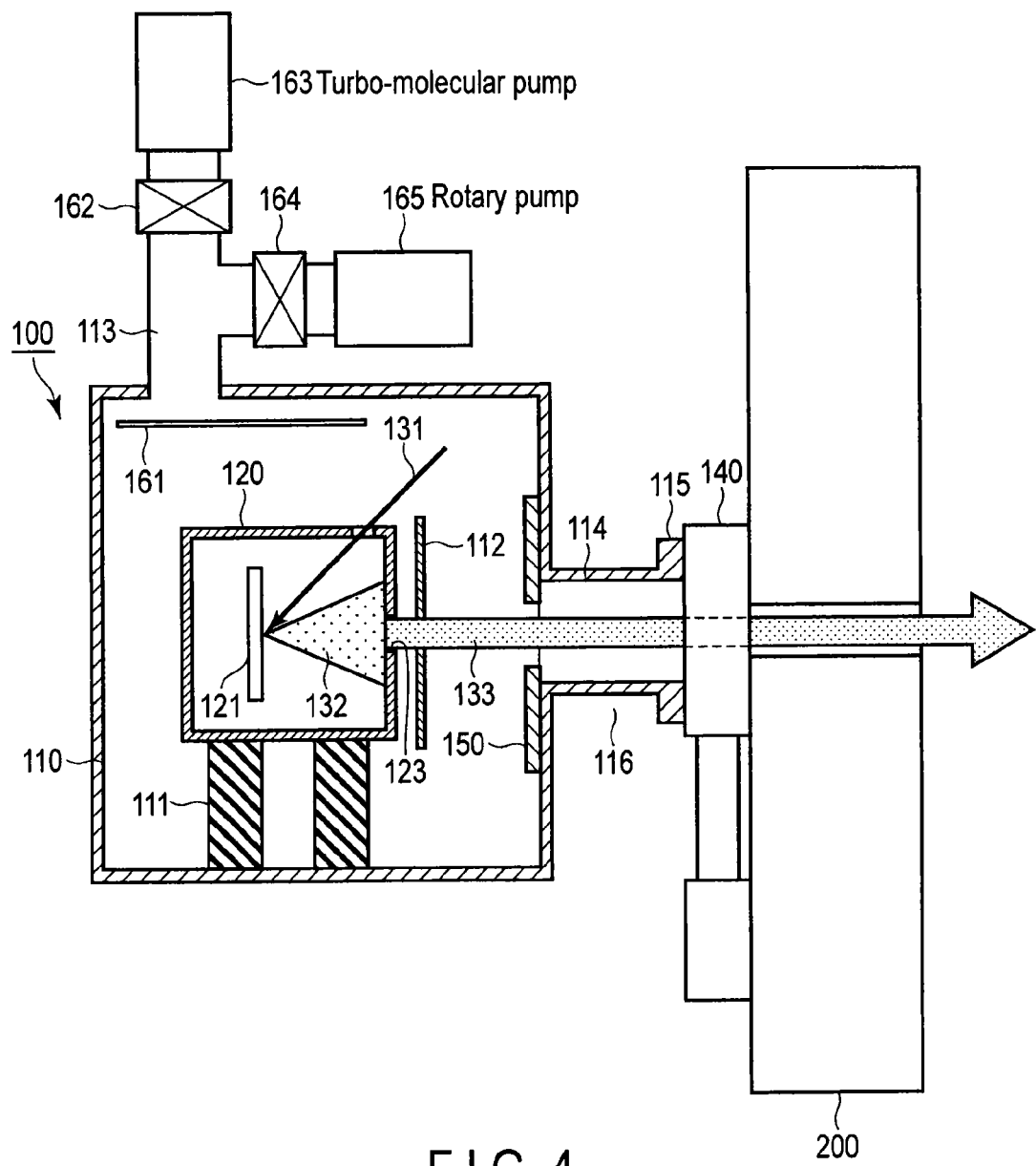
F I G. 4

F I G. 6A
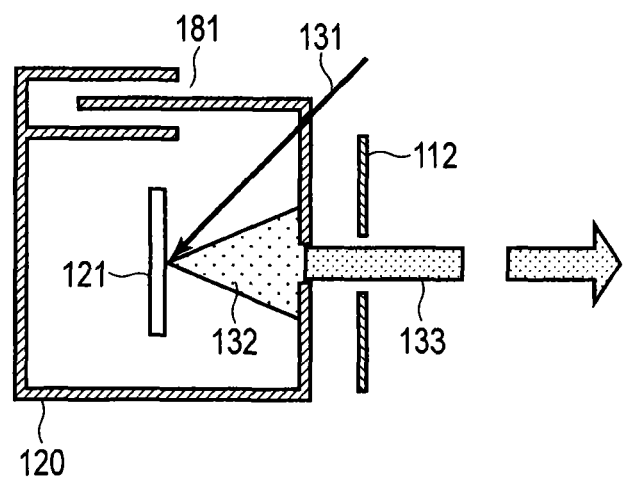
F I G. 6B
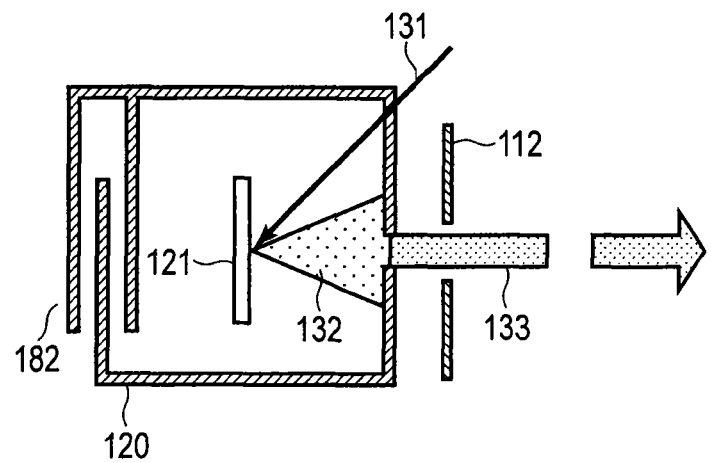

LASER ION SOURCE

CROSS REFERENCE TO RELATED APPLICATIONS

This application is a Continuation Application of PCT Application No. PCT/JP2011/074493, filed Oct. 25, 2011 and based upon and claiming the benefit of priority from Japanese Patent Application No. 2010-244302, filed Oct. 29, 2010, the entire contents of all of which are incorporated herein by reference.

FIELD

Embodiments described herein relate generally to a laser ion source which generates ions by laser light irradiation.

BACKGROUND

Recently, a cancer treatment using irradiation of high-energy carbon ions has been developed. Ion accelerating apparatuses have actually been installed in general hospitals, and treatment with such apparatuses has already been started. To further improve the performance of the apparatus of this type, an ion source which generates high-density hexahydric carbon ions is indispensable. Conventional ion sources using microwave discharge plasma are insufficient in this respect, and development of a new ion source has been strongly desired.

A laser ion source has been developed as an ion source having the ability to generate a high-density ion beam. This laser ion source applies converging laser light to a target, ionizes the target by laser light energy, and electrostatically extracts ions generated from the target to generate an ion beam.

However, the laser ion source of this type has the following problem. Laser ion sources also involve the generation of particulates during laser irradiation, which accumulate in the case housing of the source. Some of the particulates move to a vacuum evacuation device, and, for example, when a turbo-molecular pump is used, enter a bearing and prevent normal rotation or attach to a blade and become a cause of reduction in exhaust efficiency. Some of the particulates are guided outside the ion source, and adversely affect a device connected to the ion source.

To give energy sufficient for practical use to the ion beam extracted from the ion source and to control convergence, a device including a group of acceleration electrodes or an electrostatic lens is connected downstream of the ion source. In the case of use of an accelerator, a linear accelerator, such as an (raid frequency quadrupole (RFQ), is connected. In the case of use of an ion implementation device, a deflection device or an electrostatic lens is connected. This leads to complexity regardless of the configuration, and the interior of the apparatus is required to be maintained in a clean state. Therefore, release of particulates from the laser ion source is a big problem.

BRIEF DESCRIPTION OF THE DRAWINGS

FIGS. 2A-2C show a sequence of timings of gate valve open/close operations, shutter open/close operations, and laser irradiations at the laser ion source according to the first embodiment.

FIG. 3 is a schematic diagram showing quantities of ions emitted from start of a laser irradiation.

FIG. 4 is a cross section schematically showing a configuration of a laser ion source according to a second embodiment.

FIGS. 6A and 6B are cross sections each showing a configuration of an irradiation box of a laser ion source according to a fourth embodiment.

DETAILED DESCRIPTION

Figure 1:
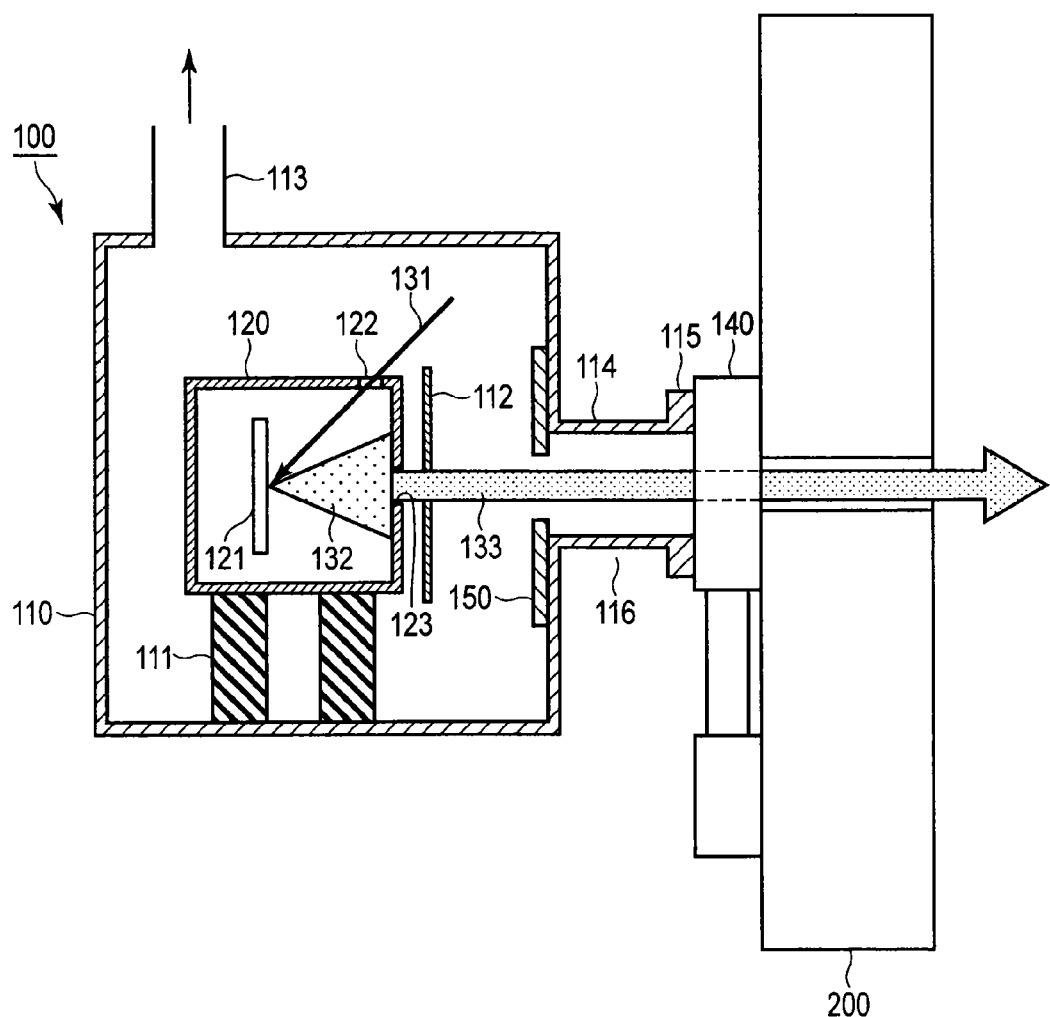
FIG. 1 is a cross section schematically showing a configuration of a laser ion source according to a first embodiment.

In general, according to one embodiment, a laser ion source is configured to generate ions by application of a laser beam, the laser ion source comprising: a case to be evacuated; an irradiation box disposed in the case and comprising a target which generates ions by irradiation of laser light; an ion beam extraction mechanism which electrostatically extracts ions from the irradiation box and guides the ions outside the case as an ion beam; a valve provided to an ion beam outlet of the case, the valve being opened at ion beam emission and being closed at other times; and a shutter provided between the valve and the irradiation box, the shutter being intermittently opened at ion beam emission and being closed at other times.

Hereinafter, details of the present invention will be described using the embodiments shown in the drawings.

First Embodiment

FIG. 1 is a cross section schematically showing a configuration of a laser ion source for accelerator use according to a first embodiment.

Element 110 in FIG. 1 is a stainless-steel vacuum case. In the middle of the case 110, an irradiation box 120 for covering a laser irradiation unit is disposed. The irradiation box 120 includes an element which turns into ions or a target 121 containing the element. The target 121 is, for example, a carbon-based plate member.

In the upper surface of the irradiation box 120, a window 122 which allows laser light to enter is formed. Via an optical system (not shown), laser light 131 is guided into the irradiation box 120, and converging laser light 131 is applied to the target 121. As the light source which emits the laser light, a $CO_2$ laser (carbon dioxide gas laser) or Nd-YAG laser may be used.

The irradiation box 120 is supported by insulation supports 111. A high voltage supply (not shown) applies a high voltage to the irradiation box 120. For positive ion beam generation, a positive electric potential is applied. For negative ion beam generation, a negative electric potential is applied.

In one side (right side in FIG. 1) of the irradiation box 120, a window 123 for taking out ions is formed. An extraction electrode 112 is disposed to face the side of the irradiation box 120 provided with the window 123. The extraction electrode 112 is a disk-shaped conductor having a circular hole at its center, and is maintained at a ground potential to extract ions from inside the irradiation box 120.

In the upper surface of the case 110, an exhaust outlet 113 is formed. A vacuum pump (not shown) is connected to the exhaust outlet 113, and evacuates the case 110. In a portion of one side of the case 110 which faces the side of the irradiation box 120 provided with the window 123, an ion beam outlet 116 is formed. The ion beam outlet 116 comprises a cylindrical member 114 connected to one side of the case 110, and a flange 115 on the end of the cylindrical member 114.

The ion source 100 comprising, for example, the case 110, irradiation box 120, and extraction electrode 112 is connected to a linear accelerator 200, such as an RFQ, on the next stage by the flange 115. When the laser ion source is used for an ion implementation device instead of an accelerator, a deflection device or an electrostatic lens is connected instead of the linear accelerator 200.

In the present embodiment, in addition to the basic elements described above, a valve 140 is provided between the flange 115 and the linear accelerator 200. The valve 140 is, for example, a gate valve or a butterfly valve attached to allow beams to pass through its openings, and has the function of opening and closing a beam passage duct while maintaining airtightness. The ion beam outlet 116 of the case 110 is provided with a shutter 150 openable and closable at a high speed.

The valve 140 follows an operation sequence in which the valve 140 is closed except when an ion beam is emitted. For example, when the ion source is included in an accelerator, the time for actually emitting ions is relatively short, and the time for vacuuming is relatively much longer. Namely, the valve 140 is opened only when ions are emitted, and is closed at other times to prevent inflow of particulates at vacuum evacuation.

The shutter 150 is open for a predetermined period of time in synchronization with a drive pulse of laser light when an ion beam is emitted. The shutter 150 is closed when ion generation is checked by applying laser light to the target 121 for conditioning of the ion source 100.

Next, the operation of the laser ion source 100 accordingly configured will be described.

Under the condition that the case 110 has been fully evacuated by, for example, a vacuum pump connected to the exhaust outlet 113, the irradiation box 120 is at a positive electric potential, and the extraction electrode 112 is at a ground electric potential, for example, when a pulse-driven laser light source (not shown) applies converging laser light 131 to the target 121, laser light 131 converging on the target 121 heats a minute portion of the target 121 at a laser converging point to a high temperature. The portion heated to a high temperature turns into plasma, and is emitted to space (132). The atoms and ions in the plasma receive energy from the laser light 131, and multivalent ions are generated.

The matter 132 emitted to the space in the irradiation box 120 is called an ablation plume, or plume in brief. The irradiation box 120 is provided with the window 123 in a direction in which the plume 132 is emitted, and the extraction electrode 112 at a ground electric potential is provided outside of the window 123. Therefore, ions are extracted from the irradiation box 120 by the electric field between the irradiation box 120 and the extraction electrode 112, and simultaneously accelerated to form an ion beam 133. The ion beam 133 is further accelerated by the linear accelerator 200.

In the irradiation box 120, not only ions but also a great quantity of particulates are generated by laser irradiation for generation of an ion beam. According to conventional configurations, particulates remain in the irradiation box 120 or case 110, but some particulates flow into the linear accelerator 200 or an exhaust pump (not shown) on the subsequent stage. However, the electrode structure of the RFQ used as the linear accelerator 200 is complicated, and is weak against inflow of dirt. In the case where a turbo-molecular pump is used as the exhaust pump, inflow of particulates into a bearing disturbs normal rotation, and, when the particulates attach to a blade, this causes reduction in exhaust efficiency.

In the present embodiment, the above problem is solved by providing the valve 140 and shutter 150 and controlling the open/close timings of the valve 140 and shutter 150.

FIGS. 2A-2C show an open/closing sequence of the valve 140 and shutter 150. FIG. 2A shows timings of gate valve open/close operations. FIG. 2B shows timings of shutter open/close operations. FIG. 2C shows timings of laser irradiations.

In a normal operation, the valve 140 is closed when the case 110 is evacuated before the operation of the ion source 100 is started, and the gate valve 140 is opened when the operation of the ion source 100 is started. Then, pulse irradiation of laser light 131 for generation of ions is performed on the target 121 in the irradiation box 120. The shutter 150 is opened slightly before pulse irradiation of laser light 131, and closed at least 10μ seconds after laser irradiation. The shutter 150 is opened and closed in synchronization with laser irradiation afterward.

In the irradiation box 120, plasma is generated by laser irradiation, and an ion beam is extracted by the extraction electrode 112. As shown in FIG. 3, within an extremely short period after the start of laser irradiation, necessary ions A (multivalent ions) are extracted, but the numbers of ions B having lower valences and particulates etc. increase after the period. Therefore, only necessary ions can be efficiently extracted by opening the shutter 150 only within an extremely short period of laser irradiation. Further, timings of shutter opening/closing can be controlled depending on what ions are necessary.

When the operation of the ion source 100 ends, irradiation of laser light 131 is stopped and the gate valve 140 is closed, thereby preventing flow of particulates in the case 110 into the linear accelerator 200 except while the ion source 100 is operating.

There is a case where ion generation is checked by applying laser light 131 to the target 121 for conditioning of the ion source 100. In this case, the valve 140 is closed, and particulates may reach a blocking surface of the valve 140 through the ejection window 123. Soiling of the valve 140 by particulates causes failure, and should be avoided with the utmost efforts. In the present embodiment, since the shutter 150 is provided between the valve 140 and the irradiation box 120, soiling of the valve 140 can be prevented by maintaining the shutter 150 closed under conditioning.

If the shutter 150 is maintained closed under conditioning as described above, soiling of the valve 140 by particulates can be prevented, but the shutter 150 is soiled. However, cleaning of the valve 140 is very troublesome, and the cost of replacing the valve 140 is high, whereas cleaning of the shutter 150 is relatively easy, and the cost of replacing the shutter 150 is low. Therefore, blocking particulates by the shutter 150 under conditioning is very advantageous.

When the case 110 is evacuated by, for example, a vacuum pump connected to the exhaust outlet 113, the quantity of particulates which flow outside the exhaust outlet 113 can be reduced since the exhaust outlet 113 is formed in the upper surface of the case 110. Further, evacuating the case 110 so that the pressure in the ion source 100 becomes lower than that in the linear accelerator 200 is effective in preventing flow of particulates into the linear accelerator 200.

According to the present embodiment, the valve 140 provided to the ion beam outlet of the case 110 enables confinement of particulates generated by laser irradiation in the case 110, thereby suppressing flow of particulates into a device connected to the ion source 100, such as the linear accelerator 200, on the subsequent stage. Further, the shutter 150 can prevent the valve 140 from being soiled by particulates under conditioning of the ion source 100. Further, vacuum evacuation from the upper surface of the case 110 can reduce the quantity of particulates which flow into a vacuum evacuation system, thereby suppressing deterioration of the vacuum pump.

The laser ion source can generate higher-density ions by laser irradiation than conventional ion sources, and is expected to be used mainly in the research field of high-energy physics and used in an accelerator for cancer treatment. Therefore, the present embodiment which solves the problem of particulates unique to laser ion sources is very advantageous when applied to this type of technical field.

Second Embodiment

FIG. 4 is a cross section schematically showing a configuration of a laser ion source for accelerator use according to a second embodiment, in particular, showing a mechanism for preventing flow of particulates into a vacuum evacuation system. The same elements as ones in FIG. 1 will be assigned the same reference symbols, and detailed descriptions thereof will be omitted.

The present embodiment differs from the first embodiment in that a baffle plate 161 is adjacent to the exhaust outlet 113 of the vacuum case 110 and provided under the exhaust outlet 113. Further, as vacuum evacuation systems, a turbo-molecular pump 163 may be connected to the exhaust outlet 113 via a valve 162, and a rotary pump 165 may be connected to the exhaust outlet 113 via a valve 164.

The particulates generated when ions are generated are believed to accumulate in the lower part of the vacuum case 110. In particular, the beginning of evacuation from the atmosphere pressure causes viscous flow which tends to involve particulates. In the present embodiment, the exhaust outlet 113 formed in the upper part of the vacuum case 110 makes it difficult to draw particulates at evacuation. Further, the baffle plate 161 is provided below the exhaust outlet 113. The baffle plate 161 hinders heavy particulates from reaching the exhaust outlet 113, thereby further suppressing flow of particulates into the vacuum evacuation system.

Using different portions of the exhaust outlet 113 for roughing and high vacuum also protects the turbo-molecular pump 163 used for high vacuum. More specifically, evacuation is performed by the rotary pump 165 without using the turbo-molecular pump 163 until the air pressure becomes 0.1 Pa, which is close to the molecular flow condition, and the turbo-molecular pump 163 is used only when the air pressure falls below 0.1 Pa, thereby producing an increased evacuation system protection effect.

The present embodiment performs the same advantages as the first embodiment as a matter of course, and can further suppress flow of particulates into a vacuum evacuation system by providing the baffle plate 161 below the exhaust outlet 113. In addition, using different portions of the exhaust outlets 113 for roughing and high vacuum enables securer protection of the turbo-molecular pump 163 used for high vacuum evacuation. It is most preferable to adopt both of using different portions of the exhaust outlets 113 for roughing and high vacuum and providing the baffle plate 161, but adopting one of the configurations performs the relevant advantage.

Third Embodiment

Figure 5:
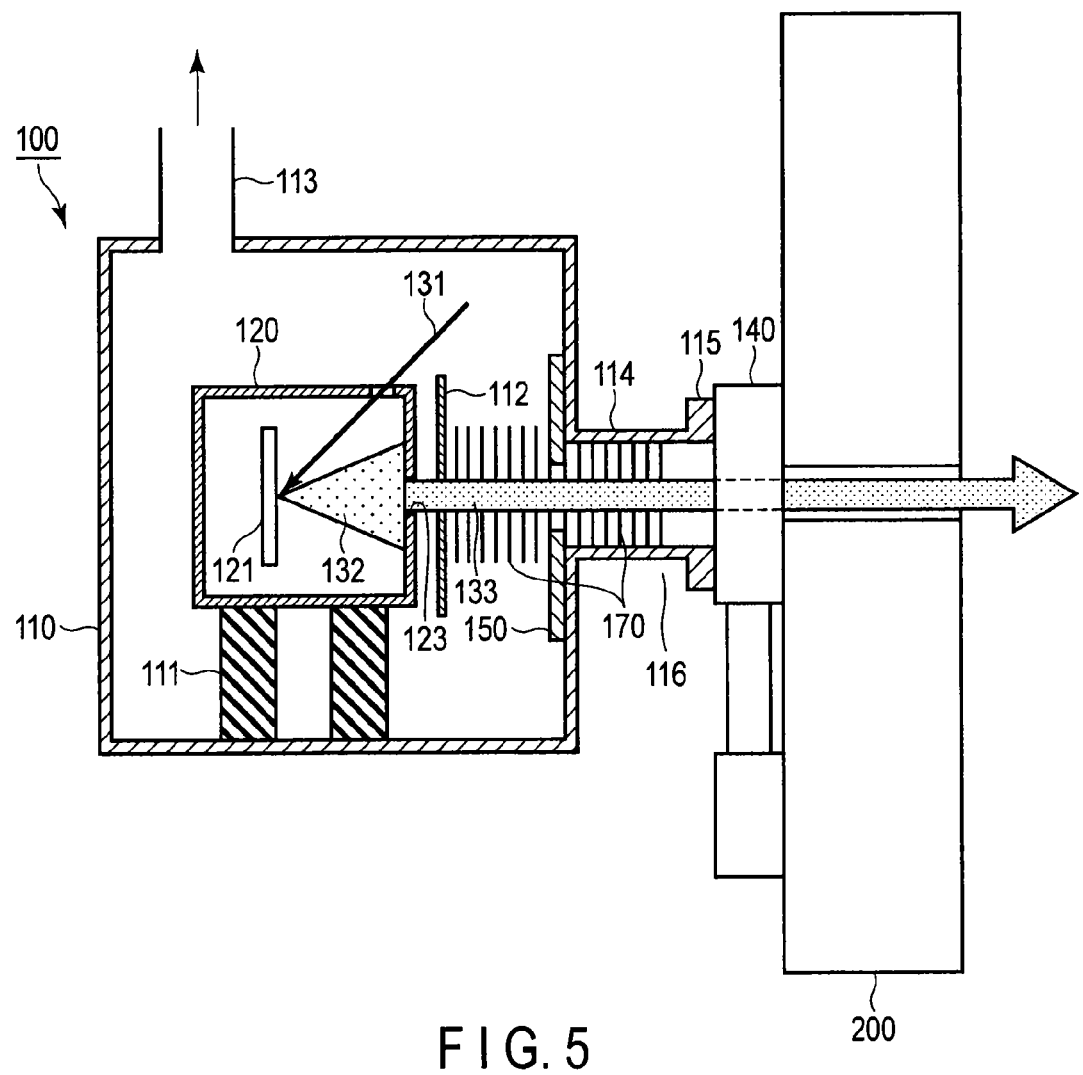
FIG. 5 is a cross section schematically showing a configuration of a laser ion source according to a third embodiment.

FIG. 5 is a cross section schematically showing configuration of a laser ion source for accelerator use according to a third embodiment. The same elements as ones in FIG. 1 will be assigned the same reference symbols, and detailed descriptions thereof will be omitted.

The present embodiment differs from the first embodiment in that a beam guide 170 is provided in a space between the extraction electrode 112 and the outlet flange 115 of the ion source. In the beam guide 170, disks each having a hole in its center are coaxially disposed in an axial direction at predetermined intervals.

Ions are converged by the extraction electrode 112, and become approximately parallel beams. However, neutral particulates continue to spread at an emission initial rate. If the beam guide 170 with disks disposed at intervals is provided, carbon atoms and particulates attach to the disks in a dispersed manner. If particulates etc. are thickly accumulated on the beam guide 170, they may come off, but the dispersion of the particulates etc. prolongs the time before they come off. If the particulates etc. do not come off, dirt in the vacuum case 110 can be removed only by replacing the beam guide 170.

The present embodiment performs the same advantages as the first embodiment as a matter of course, and can reduce dirt such as particulates remaining in the vacuum case 110 by providing the beam guide 170 for having particulates etc. attached thereto.

Fourth Embodiment

FIGS. 6A and 6B are cross sections each showing a configuration of an irradiation box of a laser ion source for accelerator use according to a fourth embodiment. The same elements as ones in FIG. 1 will be assigned the same reference symbols, and detailed descriptions thereof will be omitted.

The present embodiment employs an evacuation system having an improved configuration for the irradiation box 120. In FIG. 6A, an exhaust outlet 181 having a labyrinth structure is formed in the upper surface of the irradiation box 120, thereby preventing outflow of particulates. In FIG. 6B, an exhaust outlet 181 having a labyrinth structure is formed in a side surface of the irradiation box 120, thereby preventing outflow of particulates.

The space in the irradiation box 120 for generating plume 132 needs to be maintained in a high-vacuum state. Therefore, the conductance of evacuation needs to be high. However, particulates easily leak outside if a simple outlet is used. Therefore, the present embodiment prevents outflow of particulates from the irradiation box 120 while achieving sufficient evacuation conductance by forming the exhaust outlets 181, 182 having a labyrinth structure, which are shown in FIGS. 6A and 6B, respectively.

The present embodiment performs the same advantages as the first embodiment as a matter of course, and can suppress outflow of particulates from the irradiation box 120, and is further effective in prevention of soiling of the linear accelerator 200 and suppression of flow of particulates into a vacuum evacuation system.

Fifth Embodiment

Figure 7:
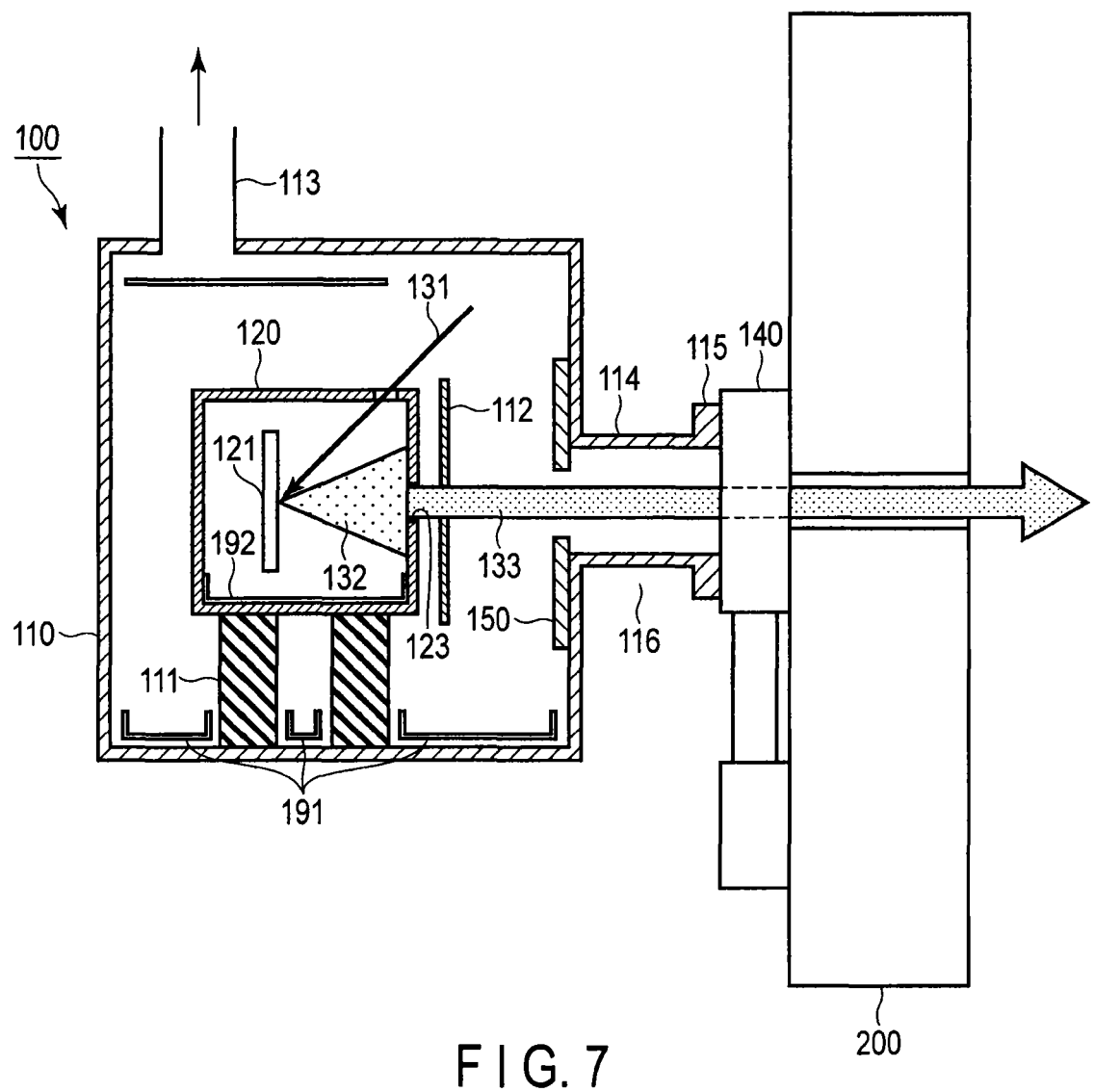
FIG. 7 is a cross section schematically showing a configuration of a laser ion source according to a fifth embodiment.

FIG. 7 is a cross section schematically showing a configuration of a laser ion source for accelerator use according to a fifth embodiment. The same elements as ones in FIG. 1 will be assigned the same reference symbols, and detailed descriptions thereof will be omitted.

The present embodiment differs from the first embodiment in that a tray 190 (191, 192) for receiving particulates is provided in the vacuum case 110 and in the irradiation box 120. More specifically, a tray 191 is disposed on the bottom of the case 110, and a tray 192 is disposed on the bottom of the irradiation box 120.

Particulates generated by laser irradiation are often accumulated on the bottom of the irradiation box 120 or the ion source case 110. Provision of trays 191, 192 having such sizes as to cover almost the entire bottom surface facilitates collection of particulates. Since the insulation supports 111 are disposed on the bottom surface of the ion source case 110, the tray 191 may be divided to avoid the insulation supports 111.

The present embodiment performs the same advantages as the first embodiment as a matter of course, and can improve maintainability because the tray 190 may be detached from the vacuum case 110 and irradiation box 120 and cleaned instead of removing particulates accumulated in the bottom part of the vacuum case 110 and irradiation box 120.

(Modification)

The present invention is not limited to the above-described embodiments, and embodiments may be combined. Further, the structures and materials etc. of elements are not limited to the ones described in the embodiments, and may be modified as appropriate in accordance with specifications.

As an example of a heavy particle, carbon was used. However, helium (He), nitrogen (N), oxygen (O), Neon (Ne), Silicon (Si) and argon (Ar) may be used in some cases.

For example, the wall surface of the irradiation box need not be a plate, and may be a mesh. The target is not limited to carbon-based one, and may be an element which turns into multivalent ions or any one containing the element. Further, the laser light source is not limited to the $CO_2$ laser or YAG laser, and may be any device capable of high-energy short pulse irradiation (several J/pulse).

The valve provided to the ion beam outlet of the vacuum case is not limited to the gate valve or butterfly valve, and may be any valve which can open and close the ion beam outlet of the vacuum case and maintain airtightness of the vacuum case and the external device such as a linear accelerator. The shutter need not be provided to the ion beam outlet of the vacuum case, and may be disposed anywhere between the valve and the extraction electrode. For example, the shutter may be disposed in the vicinity of the extraction electrode, not the ion beam outlet of the vacuum case. Further, a side of the vacuum case may be used as the extraction electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A laser ion source, comprising:
   a case to be evacuated;
   an irradiation box disposed in the case and comprising a target which generates ions by irradiation of laser light;
   an ion beam extraction mechanism which electrostatically extracts ions from the irradiation box and guides the ions outside the case as an ion beam;
   a valve provided to an ion beam outlet of the case, the valve being opened at ion beam emission and being closed at other times; and
   a shutter provided between the valve and the irradiation box, the shutter being intermittently opened at ion beam emission and being closed at other times.

2. The laser ion source of claim 1, wherein the ion beam extraction mechanism is an extraction electrode opposed to an ion ejection window of the irradiation box.

3. The laser ion source of claim 1, wherein
   the laser light is intermittently emitted by pulse driving, and
   the shutter is open for a predetermined period of time in synchronization with a drive pulse of the laser light.

4. The laser ion source of claim 1, wherein
   an exhaust outlet for vacuum evacuation of the case is provided in an upper surface of the case.

5. The laser ion source of claim 4, wherein
   a blocking plate which covers the exhaust outlet when viewed from the irradiation box is provided at a predetermined distance from the exhaust outlet.

6. The laser ion source of claim 2, wherein
   a transport space in which disks each having a hole at a center are coaxially disposed at predetermined intervals is provided between the extraction electrode and the ion beam outlet.

7. The laser ion source of claim 1, wherein
   an exhaust outlet having a labyrinth structure for evacuating the irradiation box is provided in at least one of an upper surface, back surface and side surfaces of the irradiation box.

8. The laser ion source of claim 1, wherein
   on a bottom surface of at least one of the case and the irradiation box, a tray is provided to cover the bottom surface.

* * * * *